(12) United States Patent
Dan et al.

(10) Patent No.: US 12,335,702 B2
(45) Date of Patent: Jun. 17, 2025

(54) METHOD FOR MANUFACTURING MEMS ACOUSTIC SENSOR

(71) Applicant: AAC Kaitai Technologies (Wuhan) CO., LTD, Hubei (CN)

(72) Inventors: Qiang Dan, Wuhan (CN); Chungmin Li, Taiwan (CN); KianHeng Goh, Batu Pahat (MY); Kahkeen Lai, Singapore (SG); Yang Li, Wuhan (CN)

(73) Assignee: AAC Kaitai Technologies (Wuhan) CO., LTD, Wuhan (CN)

( * ) Notice: Subject to any disclaimer, the term of this patent is extended or adjusted under 35 U.S.C. 154(b) by 251 days.

(21) Appl. No.: 18/323,393

(22) Filed: May 24, 2023

(65) Prior Publication Data

US 2024/0284131 A1 Aug. 22, 2024

Related U.S. Application Data

(63) Continuation of application No. PCT/CN2023/081085, filed on Mar. 13, 2023.

(30) Foreign Application Priority Data

Feb. 20, 2023 (CN) .......................... 202310148526.3

(51) Int. Cl.
| | |
|---|---|
| H04R 31/00 | (2006.01) |
| H04R 17/02 | (2006.01) |
| H10N 30/05 | (2023.01) |
| H10N 30/06 | (2023.01) |

(52) U.S. Cl.
CPC ......... *H04R 31/006* (2013.01); *H04R 17/025* (2013.01); *H10N 30/05* (2023.02); *H10N 30/06* (2023.02); *H04R 2201/003* (2013.01)

(58) Field of Classification Search
CPC ................ H04R 31/006; H04R 17/025; H04R 2201/003; H04R 31/00; H10N 30/05; H10N 30/06
See application file for complete search history.

(56) References Cited

U.S. PATENT DOCUMENTS

2023/0007406 A1* 1/2023 Cheng .................... H04R 19/02

* cited by examiner

*Primary Examiner* — Tuan D Nguyen
(74) *Attorney, Agent, or Firm* — Wiersch Law Group

(57) ABSTRACT

Provided is a method for manufacturing a MEMS acoustic sensor. A structural layer and a piezoelectric material layer are stacked on the substrate. Photolithography modeling is performed on the piezoelectric material layer and the structural layer. A polymer layer is stacked on the piezoelectric material layer. The substrate is etched to form a cavity. A first part of a jig is stacked on the polymer layer. The jig, the substrate, the piezoelectric material layer, and the polymer layer are heated. Air is introduced into the cavity and a pressure inside the cavity is controlled. An atmospheric pressure load of the air is maintained and the air is cooled. The pressure inside the cavity is stopped to be controlled and the pressure inside the cavity is reduced, the jig is disassembled, and a wafer is cut to obtain the MEMS acoustic sensor, to effectively improve the accuracy and reliability in processing.

8 Claims, 8 Drawing Sheets

METHOD FOR MANUFACTURING MEMS ACOUSTIC SENSOR

CROSS REFERENCE TO RELATED APPLICATIONS

The present application is a continuation of PCT Patent Application No. PCT/CN2023/081085, entitled "METHOD FOR MANUFACTURING MEMS ACOUSTIC SENSOR," filed Mar. 13, 2023, which claims priority to Chinese patent application No. 202310148526.3, entitled "METHOD FOR MANUFACTURING MEMS ACOUSTIC SENSOR," filed Feb. 20, 2023, each of which is incorporated by reference herein in its entirety, which is incorporated herein by reference in its entirety.

TECHNICAL FIELD

The present disclosure relates to the technical field of manufacturing MEMSs, in particular to a method for manufacturing MEMS acoustic sensor.

BACKGROUND

A MEMS acoustic sensor is widely used in portable mobile electronic products, such as a mobile phone, to convert audio signals into sound for playback. The miniaturization of the portable mobile electronic products has driven the miniaturization of MEMS acoustic sensor to become increasingly widespread.

In the conventional art, the MEMS acoustic sensor includes a substrate having a cavity and opened at both ends, a cantilever beam bending and extending from one end of the substrate towards the cavity, a piezoelectric actuator fixed on a side of the cantilever beam away from the cavity, and an elastic connector made of a polymer layer. There are multiple cantilever beams mutually spaced apart from each other, and a structural gap is formed between adjacent two cantilever beams. The elastic connector completely covers the multiple cantilever beams, the piezoelectric actuator, and the cavity and is attached to the multiple cantilever beams and the piezoelectric actuator. The elastic connector, the multiple cantilever beams, and the piezoelectric actuator jointly form a piezoelectric composite vibration film structure configured to vibrate to generate sound. The MEMS acoustic sensor in the conventional art seals the structural gap by the elastic connector, so that there is no short circuit in response to the MEMS acoustic sensor emitting sound or detecting sound pressure. A part of the elastic connector directly opposite to the structural gap is in an arch shape. Due to the low bending stiffness of the arch, an arch design having small vibration resistance can minimize the vibration limitation on the multiple cantilever beams or other forms of drivers, and improve the sensitivity of sound generation or detection.

However, in the production of the MEMS acoustic sensor in the conventional art, the arch component of the elastic connector is generally prepared separately in advance. The production method is generally to prepare a certain 3D structure of the thin film by hot pressing a polymer flat film or injection molding, and the thin film is pasted onto the surface of the prepared driver (i.e., covering the structural gap) by mechanical equipment. However, there are the following problems in the production of the MEMS acoustic sensor in the conventional art. To begin with, the alignment accuracy is not desirable, and the alignment accuracy of traditional mechanical equipment cannot be mentioned in the same breath as the alignment accuracy in producing MEMS, resulting in low consistency of MEMS acoustic sensor. Moreover, the pasted part of the surface of the driver is extremely fragile (all at the micrometer level), a cantilever structure is impossible to withstand the force of adhesion, resulting in extremely low yield.

Therefore, it is necessary to provide a new method for manufacturing a MEMS acoustic sensor to solve the above technical problems.

SUMMARY

An object of the present disclosure is to overcome the above technical problems and provide a method for manufacturing a MEMS acoustic sensor, to effectively improve the accuracy and reliability in processing.

In order to achieve the above objective, a method for manufacturing a MEMS acoustic sensor is provided according to the present disclosure, and the method includes the following operations:

providing a substrate, and sequentially stacking a structural layer and a piezoelectric material layer on a side of the substrate;

performing photolithography modeling on the piezoelectric material layer and the structural layer sequentially to generate a first groove penetrating through the piezoelectric material layer and a second groove penetrating through the structural layer, respectively; where the first groove is arranged directly opposite to and in communication with the second groove to form a structural gap together;

stacking a polymer layer on a side of the piezoelectric material layer away from the substrate, and completely covering the first groove with the polymer layer;

etching the substrate in a direction from a side of the substrate away from the piezoelectric material layer towards the piezoelectric material layer, so that the substrate forms a cavity penetrating through the substrate, where the structural layer is covered on the side of the substrate close to the piezoelectric material layer to enable the second groove to be in communication with the cavity;

stacking a first part of a prefabricated jig on a side of the polymer layer away from the substrate, where an arch groove is defined on the first part to enable the arch groove to be arranged directly opposite to the structural gap; heating the jig, the substrate, the piezoelectric material layer, and the polymer layer together to a first temperature to enable the polymer layer to be in a rubbery state, where a first ventilation hole penetrating through the first part is further defined on the first part, the first ventilation hole is in communication with the arch groove and outside, and the first temperature is a glassy transition temperature of the polymer layer;

introducing air at a predetermined pressure into the cavity and controlling a pressure inside the cavity to reach a predetermined value, to enable a part of the polymer layer opposite to the arch groove to deform and adhere to an inner wall of the arch groove to form an arch portion;

maintaining an atmospheric pressure load of the air and cooling the air to below the first temperature, to enable the polymer layer to be in a glassy state; and stop controlling the pressure inside the cavity and reducing the pressure inside the cavity, disassembling the jig, and cutting a wafer according to a preset shape to obtain the MEMS acoustic sensor.

As an improvement, the substrate is an SOI wafer or a silicon wafer, and the piezoelectric material layer includes at least one layer of piezoelectric material and an upper electrode and a lower electrode attached to opposite sides of the piezoelectric material, respectively.

As an improvement, the piezoelectric material is any one of PZT, AlN, AlScN, and ZnO.

As an improvement, the polymer layer is any one of PEEK, PEI, PI, or PEN.

As an improvement, the operation of introducing the air at the predetermined pressure into the cavity includes:

stacking a second part of the jig on the side of the substrate away from the piezoelectric material layer and completely covering the cavity, where a second ventilation hole penetrating through the second part is defined on the second part, to enable the cavity to be in communication with the second ventilation hole; and introducing the air at the predetermined pressure into the cavity through the second ventilation hole.

As an improvement, there are multiple first grooves and multiple second grooves, and the multiple first grooves are in one-to-one correspondence with the multiple second grooves.

As an improvement, the polymer layer is in a shape of block and completely covers the structural gap.

As an improvement, a groove width of the arch groove is greater than or equal to a width of the structural gap.

Compared with the conventional art, in the method for manufacturing a MEMS acoustic sensor provided according to the present disclosure, a substrate is provided, and a structural layer and a piezoelectric material layer are stacked sequentially on a side of the substrate. Photolithography modeling is sequentially performed on the piezoelectric material layer and the structural layer to generate a first groove penetrating through the piezoelectric material layer and a second groove penetrating through the structural layer, respectively. The first groove is arranged directly opposite to and in communication with the second groove to form a structural gap together. A polymer layer is stacked on a side of the piezoelectric material layer away from the substrate, and the polymer layer completely covers the first groove. The substrate is etched in a direction from a side of the substrate away from the piezoelectric material layer towards the piezoelectric material layer, so that the substrate forms a cavity penetrating through the substrate, where the structural layer is covered on the side of the substrate close to the piezoelectric material layer to enable the second groove to be in communication with the cavity. A first part of a prefabricated jig is stacked on a side of the polymer layer away from the substrate, where an arch groove is defined on the first part to enable the arch groove to be arranged directly opposite to the structural gap. The jig, the substrate, the piezoelectric material layer, and the polymer layer are heated together to a first temperature to enable the polymer layer to be in a rubbery state, where a first ventilation hole penetrating through the first part is further defined on the first part, the first ventilation hole is in communication with the arch groove and outside, and the first temperature is a glassy transition temperature of the polymer layer. Air at a predetermined pressure is introduced into the cavity and a pressure inside the cavity is controlled to reach a predetermined value, to enable a part of the polymer layer opposite to the arch groove to deform and adhere to an inner wall of the arch groove to form an arch portion. An atmospheric pressure load of the air is maintained and the air is cooled to below the first temperature, to enable the polymer layer to be in a glassy state. The pressure inside the cavity is stopped to be controlled and the pressure inside the cavity is reduced, the jig is disassembled, and a wafer is cut according to a preset shape to obtain the MEMS acoustic sensor. In the above operations, the significant changes in the mechanical properties of the polymer layer at the first temperature and the load control of temperature and air pressure to achieve the preparation of 3D morphology. Due to the absence of traditional assembly processes during the implementation process, the alignment accuracy is high, yield is high, repeatability is desirable, and the cost is low, and the process is simple. Thus, the method for manufacturing a MEMS acoustic sensor provided according to the present disclosure can effectively improve the accuracy and reliability in processing.

BRIEF DESCRIPTION OF THE DRAWINGS

For more clearly illustrating embodiments of the present disclosure or the technical solutions in the conventional technology, drawings referred to for describing the embodiments or the conventional technology will be briefly described hereinafter. Apparently, drawings in the following description are only examples of the present disclosure, and for the person skilled in the art, other drawings may be acquired based on the provided drawings without any creative efforts.

DETAILED DESCRIPTION

The technical solutions according to the embodiments of the present disclosure will be described clearly and completely as follows in conjunction with the drawings in the embodiments of the present disclosure. It is apparent that the described embodiments are only a part of the embodiments according to the present disclosure, rather than all the embodiments. Based on the embodiments of the present disclosure, all other embodiments obtained without creative efforts by those of ordinary skill in the art shall fall within the protection scope of the present disclosure.

First Embodiment

A method for manufacturing a MEMS acoustic sensor is provided according to the present disclosure. Referring to FIG. 1 to FIG. 11, in this embodiment, the method for manufacturing a MEMS acoustic sensor is used to manufacture a MEMS acoustic sensor 100.

Figure 1:
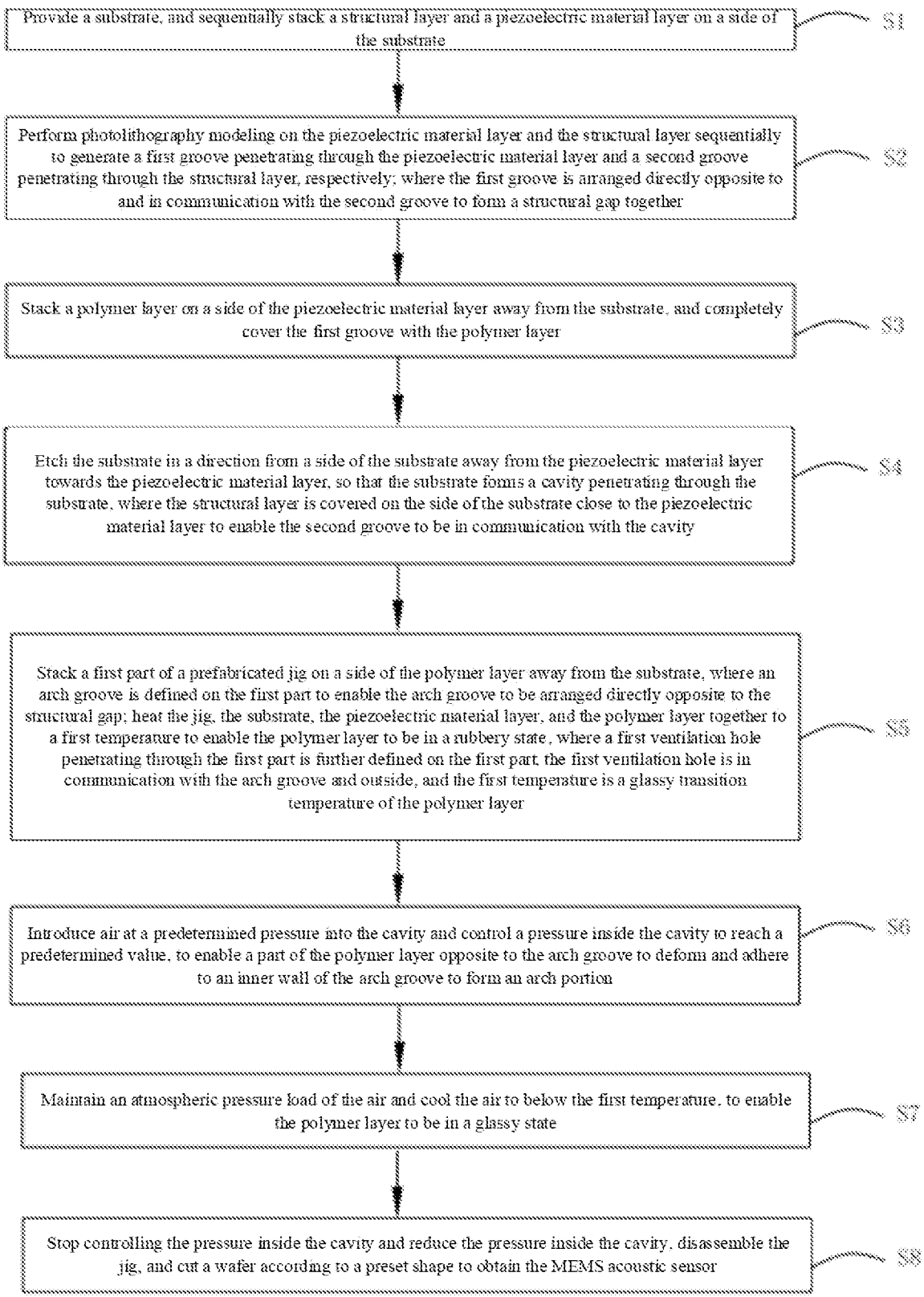
FIG. 1 is a flowchart of a method for manufacturing a MEMS acoustic sensor provided according to the present disclosure.
Figure 2:
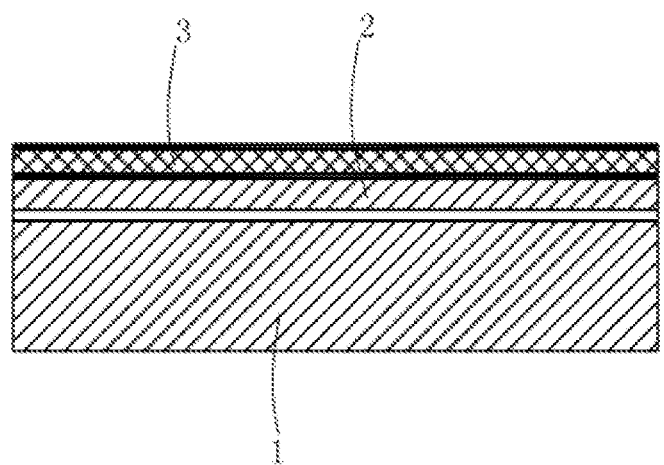
FIG. 2 is a schematic structural view of a MEMS acoustic sensor after operation S1 of a first embodiment of a method for manufacturing a MEMS acoustic sensor provided according to the present disclosure.
Figure 3:
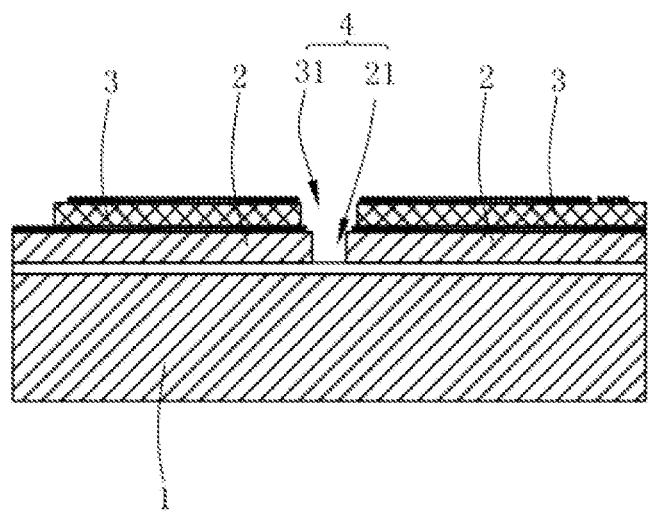
FIG. 3 is a schematic structural view of a MEMS acoustic sensor after operation S2 of a first embodiment of a method for manufacturing a MEMS acoustic sensor provided according to the present disclosure.
Figure 4:
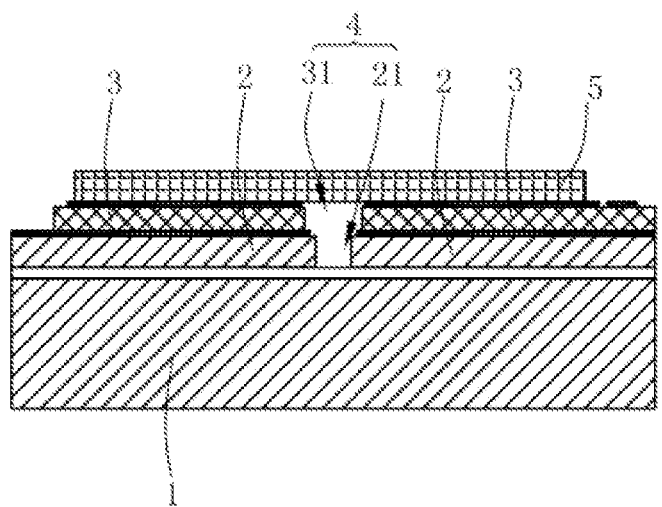
FIG. 4 is a schematic structural view of a MEMS acoustic sensor after operation S3 of a first embodiment of a method for manufacturing a MEMS acoustic sensor provided according to the present disclosure.
Figure 5:
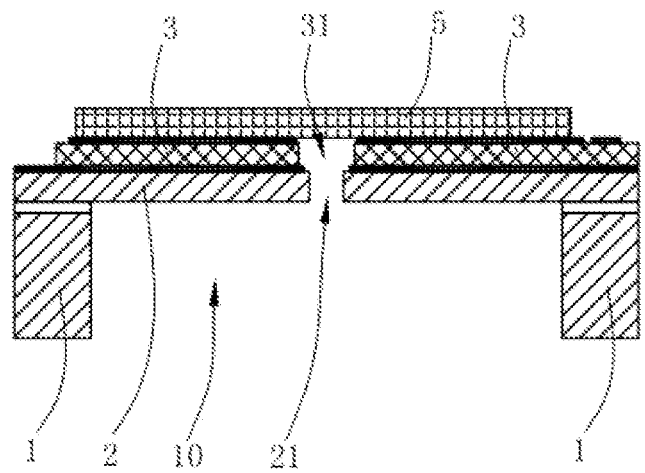
FIG. 5 is a schematic structural view of a MEMS acoustic sensor after operation S4 of a first embodiment of a method for manufacturing a MEMS acoustic sensor provided according to the present disclosure.
Figure 6:
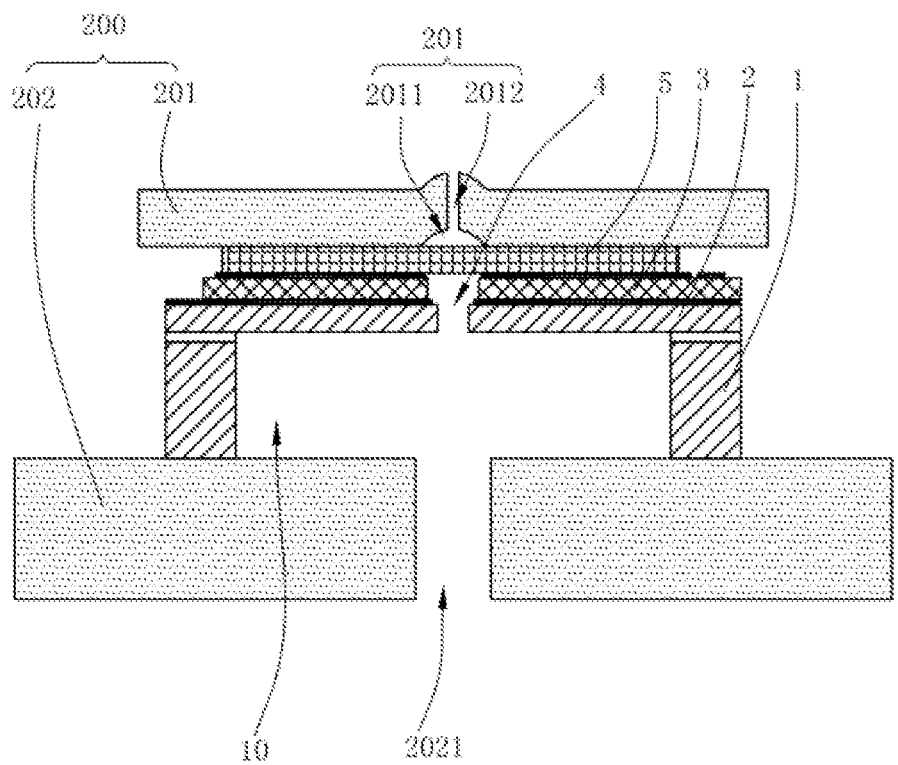
FIG. 6 is a schematic structural view of a MEMS acoustic sensor after operation S5 of a first embodiment of a method for manufacturing a MEMS acoustic sensor provided according to the present disclosure.
Figure 7:
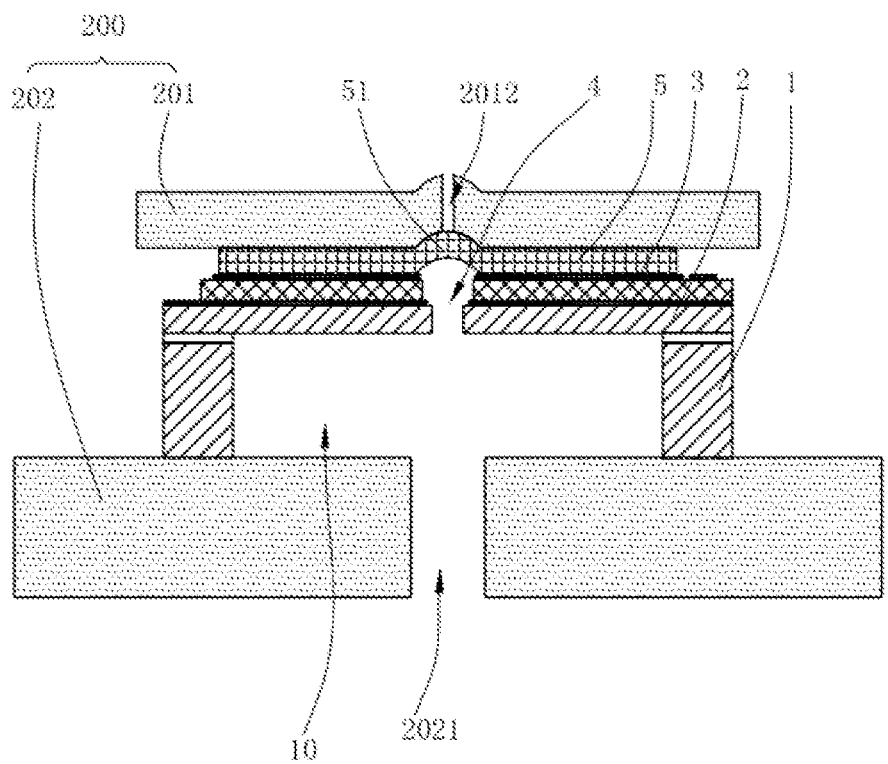
FIG. 7 is a schematic structural view of a MEMS acoustic sensor after operation S6 of a first embodiment of a method for manufacturing a MEMS acoustic sensor provided according to the present disclosure.
Figure 8:
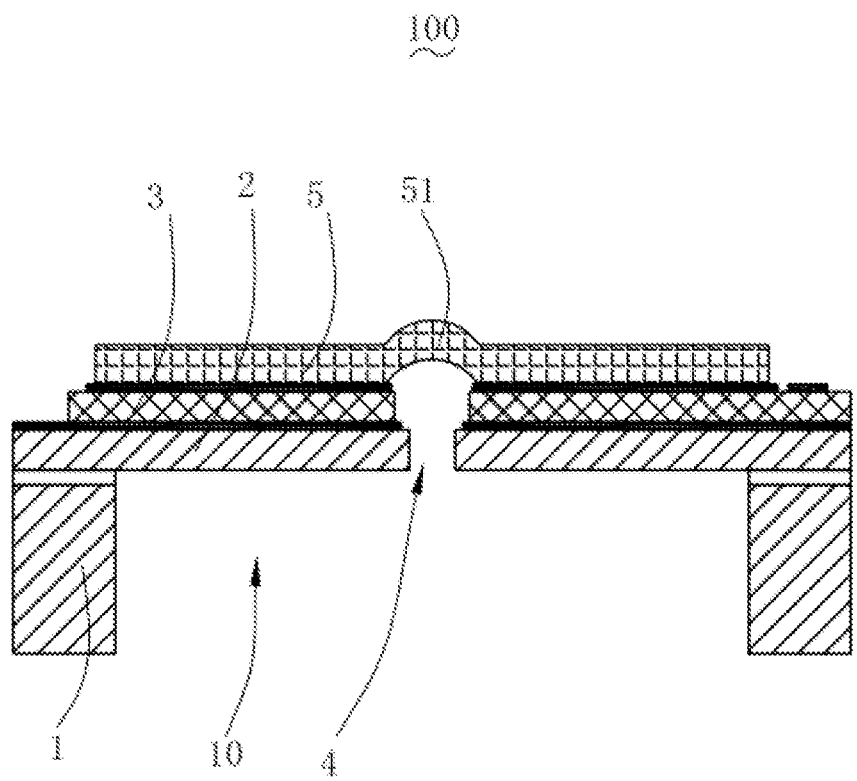
FIG. 8 is a schematic structural view of a MEMS acoustic sensor after operation S8 of a first embodiment of a method for manufacturing a MEMS acoustic sensor provided according to the present disclosure.

Referring to FIG. 1, specifically, the method for manufacturing a MEMS acoustic sensor includes the following operations S1 to S8.

In operation S1, a substrate 1 is provided, and a structural layer 2 and a piezoelectric material layer 3 are stacked sequentially on a side of the substrate 1.

In operation S1, the substrate 1 is a SOI wafer or a silicon wafer.

The piezoelectric material layer 3 includes at least one layer of piezoelectric material and an upper electrode and a lower electrode attached to opposite sides of the piezoelectric material, respectively. The piezoelectric material is any one of PZT, AlN, AlScN, and ZnO.

In operation S2, photolithography modeling is sequentially performed on the piezoelectric material layer 3 and the structural layer 2 to generate a first groove 31 penetrating through the piezoelectric material layer 3 and a second groove 21 penetrating through the structural layer 2, respectively.

The first groove 31 is arranged directly opposite to and in communication with the second groove 21 to form a structural gap 4 together.

The first groove 31 is configured to generate the main structure of a piezoelectric actuator for the MEMS acoustic sensor 100 from the piezoelectric material layer 3.

In operation S3, a polymer layer 5 is stacked on a side of the piezoelectric material layer 3 away from the substrate 1, and the polymer layer 5 completely covers the first groove 31.

In this embodiment, the polymer layer 5 is any one of PEEK, PEI, PI, and PEN.

In this embodiment, the polymer layer 5 is in a block shape that matches the shape of the piezoelectric material layer 3.

It should be noted that the method for manufacturing the MEMS acoustic sensor can have other changes in the main structure of the piezoelectric actuator prepared in operations S1 and S2. For example, the upper electrode can be made after the operation S2, which ensures that the vibration structure and the functional layer composed of the piezoelectric material layer 3 and the structural layer 2 have been completed before the operation S3.

In operation S4, the substrate 1 is etched in a direction from a side of the substrate 1 away from the piezoelectric material layer 3 towards the piezoelectric material layer 3, so that the substrate 1 forms a cavity 10 penetrating through the substrate 1, where the structural layer 2 is covered on the side of the substrate 1 close to the piezoelectric material layer 3 to enable the second groove 21 to be in communication with the cavity 10.

After the operation S4 is completed, the vibration structure composed of the piezoelectric material layer 3 and the structural layer 2 can be released for vibration. Before the operation S4, it is necessary to perform the operation S3 to attach the polymer layer 5 to the piezoelectric material layer 3. In response to the cavity 10 being etched and then the polymer layer 5 being attached, the cantilever structure formed by etching the piezoelectric material layer 3 is not bearable at all, and the success rate of attachment and fixation is low.

In operation S5, a first part 201 of a prefabricated jig 200 is stacked on a side of the polymer layer 5 away from the substrate 1, where an arch groove 2011 is defined on the first part 201 to enable the arch groove 2011 to be arranged directly opposite to the structural gap 4. The jig 200, the substrate 1, the piezoelectric material layer 3, and the polymer layer 5 are heated together to a first temperature Tg to enable the polymer layer 5 to be in a rubbery state. The rubber state refers to a state where the Young's modulus of the polymer layer 5 is low and prone to deformation.

A first ventilation hole 2012 penetrating through the first part 201 is further defined on the first part 201, the first ventilation hole 2012 is in communication with the arch groove 2011 and outside, and the first temperature Tg is a glassy transition temperature of the polymer layer 5.

In this embodiment, a groove width of the arched groove 2011 is greater than or equal to a width of the structural gap 4. This structure is beneficial for improving the performance of the MEMS acoustic sensor 100.

In operation S6, air at a predetermined pressure is introduced into the cavity 10 and a pressure inside the cavity 10 is controlled to reach a predetermined value, to enable a part of the polymer layer 5 opposite to the arch groove 2011 to deform and adhere to an inner wall of the arch groove 2011 to form an arch portion 51.

In this embodiment, the operation of introducing the air at the predetermined pressure into the cavity 10 includes:
  stacking a second part 202 of the jig 200 on the side of the substrate 1 away from the piezoelectric material layer 3 and completely covering the cavity 10.

A second ventilation hole 2021 penetrating through the second part 202 is defined on the second part 202, to enable the cavity 10 to be in communication with the second ventilation hole 2021. The air at the predetermined pressure is introduced into the cavity 10 through the second ventilation hole 2021. The predetermined pressure is closely related to the height of the final arch portion 51. Of course, in another embodiment, there is no second part 202, that is, the jig 200 is only provided with the first part 201, so as long as the air pressure is large enough, a specific arch shape can be prepared. The arch portion of the forming jig of the polymer layer 5 requires a certain number of small holes for the deformation of the polymer layer 5. In addition, areas outside the arch portion 51 can also be prepared into partial point contact, which reduces the adhesion between the mold and the polymer layer 5 after the process is completed.

In this embodiment, the structural gap 4 is arranged opposite to the second ventilation hole 2021. Due to the low stiffness of the arch portion 51, the arch portion 51 of the polymer layer 5 is located directly opposite the structural gap 4, which can prevent sound leakage without excessive interference with its vibration. On the contrary, in response to the polymer layer 5 being laid flat at the structural gap 4, the vibration of the MEMS acoustic sensor 100 will be greatly limited, the sensitivity is reduced.

In operation S7, an atmospheric pressure load of the air is maintained and the air is cooled to below the first temperature Tg, to enable the polymer layer 5 to be in a glassy state.

In operation S8, the pressure inside the cavity 10 is stopped to be controlled and the pressure inside the cavity 10 is reduced, the jig 200 is disassembled, and a wafer is cut according to a preset shape to obtain the MEMS acoustic sensor 100.

Figure 9:
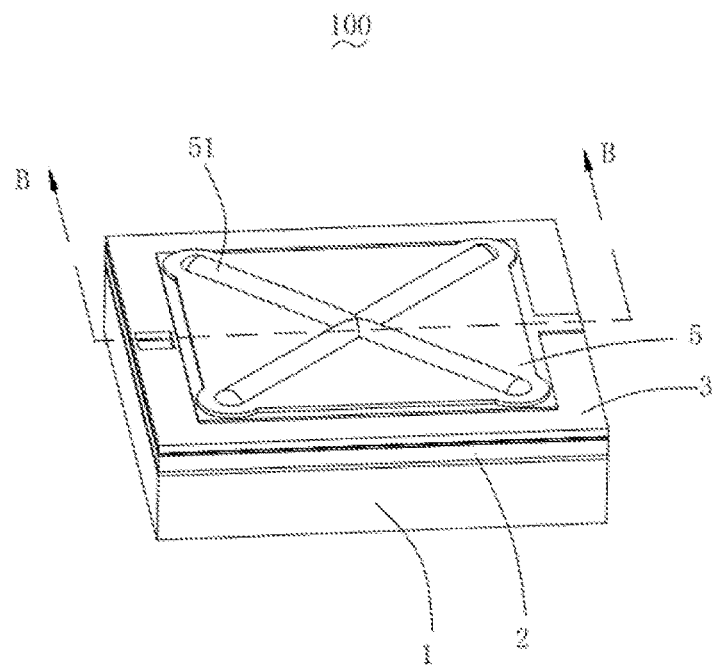
FIG. 9 is a schematic three-dimensional view of a MEMS acoustic sensor after operation S8 of a first embodiment of a method for manufacturing a MEMS acoustic sensor provided according to the present disclosure.
Figure 10:
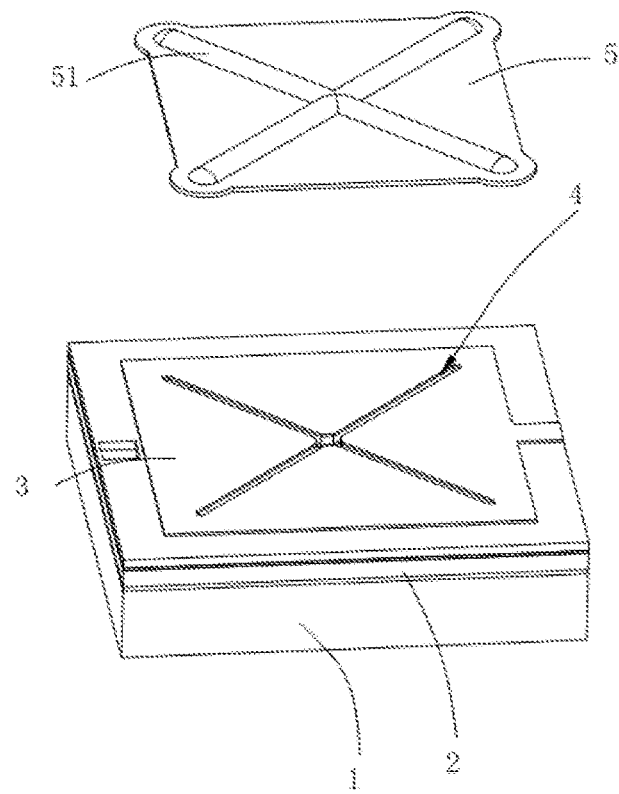
FIG. 10 is a schematic partial three-dimensional view of a MEMS acoustic sensor after operation S8 of a first embodiment of a method for manufacturing a MEMS acoustic sensor provided according to the present disclosure.
Figure 11:
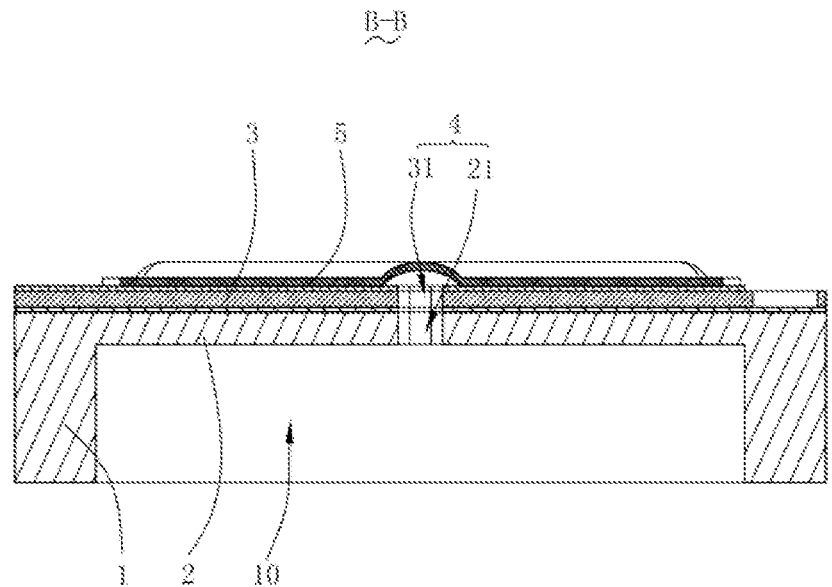
FIG. 11 is a cross-sectional view along B-B direction shown in FIG. 9.

The MEMS acoustic sensor 100 can be made by implementing operations S1 to S8. Reference is made to FIG. 9 to FIG. 11.

Specifically, the MEMS acoustic sensor 100 includes a substrate 1 formed with a cavity 10 and opened at both ends, a structural layer 2 extending from a side of the substrate 1 to the cavity 10 and at least partially suspended above the cavity 10, a piezoelectric material layer 3 fixed to the side of a cantilever beam away from the cavity 10, and a polymer layer 5.

A structural gap 4 penetrating through the structural layer 2 is defined on the structural layer 2. The structural gap 4 is in communication with the cavity 10. The structural layer 2 is configured to manufacture the cantilever beam. The piezoelectric material layer 3 is configured to manufacture a piezoelectric driver.

The polymer layer 5 completely covers the structural layer 2, the piezoelectric material layer 3, and the cavity 10, and is adhered to the structural layer 2 and the piezoelectric material layer 3. A part of the polymer layer 5 arranged opposite to the structural gap 4 recesses towards a side away from the cavity 10 to form an arch portion 51.

In this embodiment, the polymer layer 5 is in a shape of block and completely covers the structural gap 4. Among them, the polymer layer 5 is in a block shape that matches the shape of the piezoelectric material layer 3. The structure is compact, easy to manufacture, and has high reliability.

Second Embodiment

A method for manufacturing a MEMS acoustic sensor according to the second embodiment of the present disclosure is used to manufacture a MEMS acoustic sensor 100a.

The MEMS acoustic sensor 100a of the second embodiment of the present disclosure is basically the same as the MEMS acoustic sensor 100 of the first embodiment of the present disclosure. The difference between the MEMS acoustic sensor 100a of the second embodiment of the present disclosure and the MEMS acoustic sensor 100 is as follows.

Figure 12:
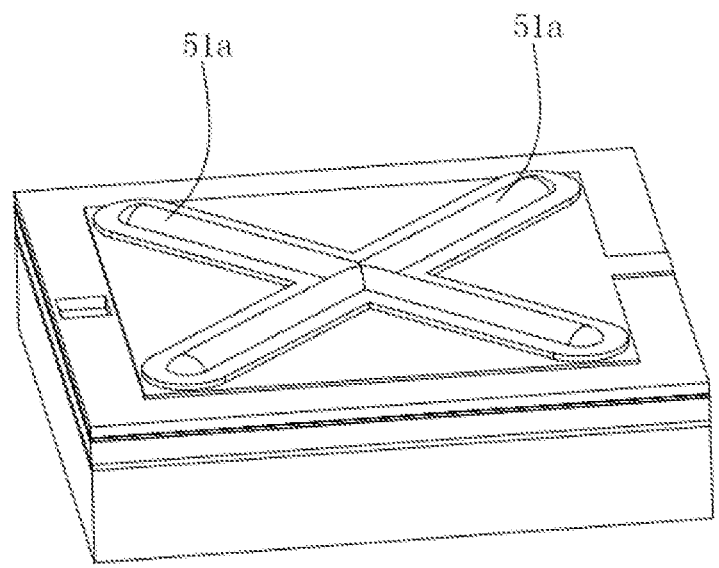
FIG. 12 is a schematic three-dimensional view of a MEMS acoustic sensor after operation S8 of a second embodiment of a method for manufacturing a MEMS acoustic sensor provided according to the present disclosure.
Figure 13:
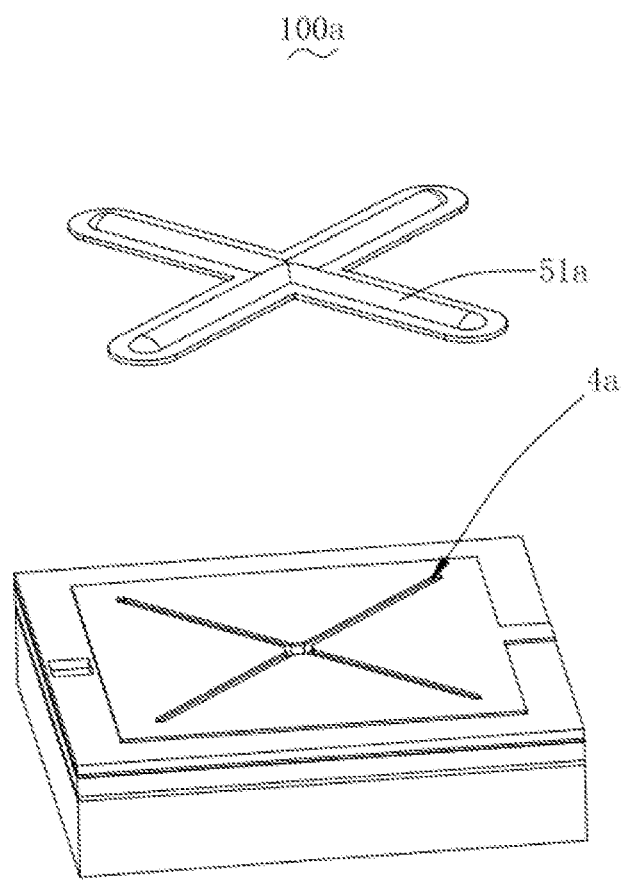
FIG. 13 is a schematic partial three-dimensional view of a MEMS acoustic sensor after operation S8 of a second embodiment of a method for manufacturing a MEMS acoustic sensor provided according to the present disclosure.
Figure 14:
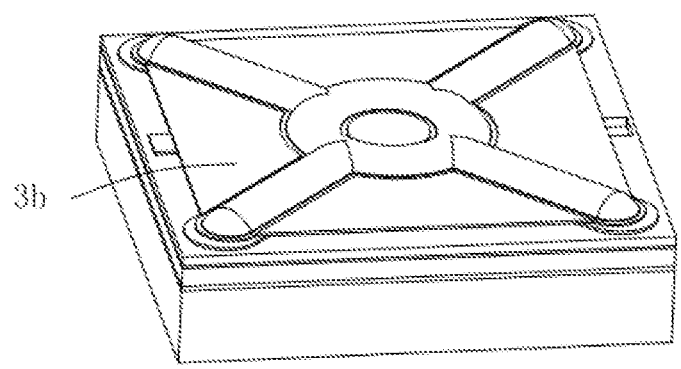
FIG. 14 is a schematic three-dimensional view of a MEMS acoustic sensor after operation S8 of a third embodiment of a method for manufacturing a MEMS acoustic sensor provided according to the present disclosure.
Figure 15:
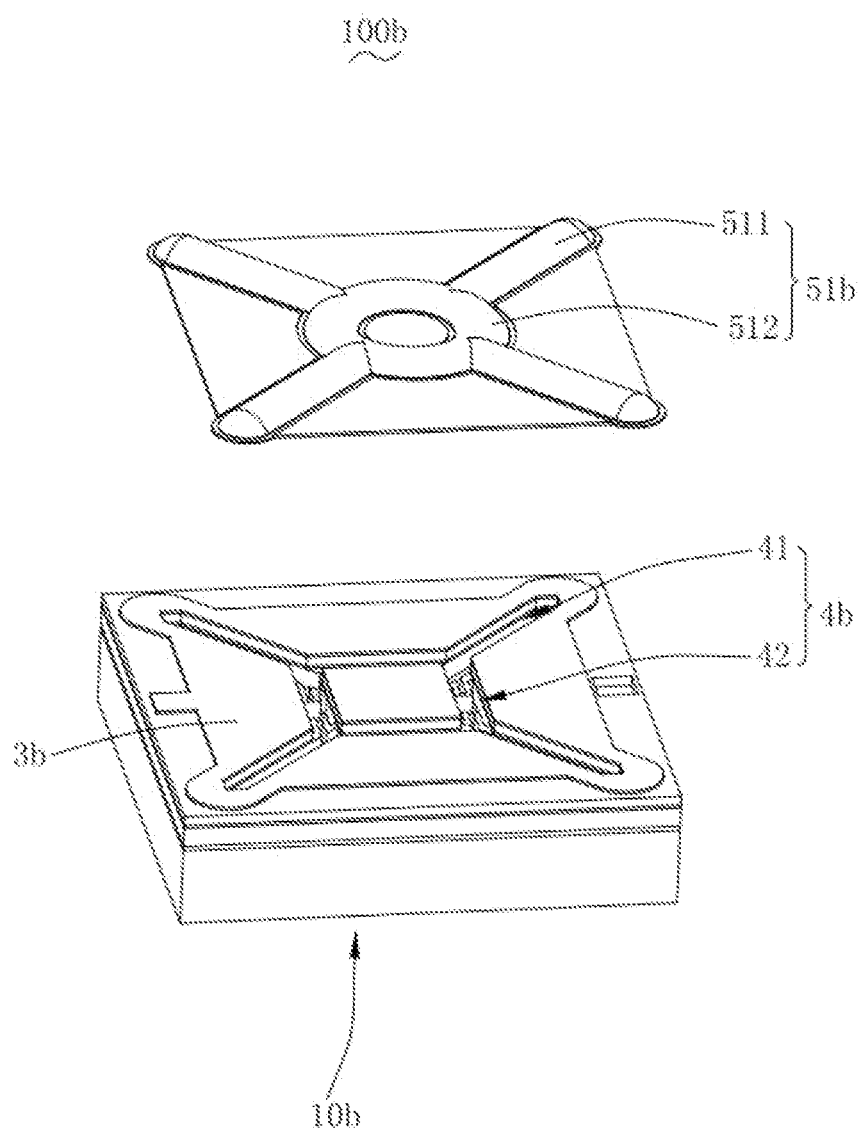
FIG. 15 is a schematic partial three-dimensional view of a MEMS acoustic sensor after operation S8 of a third embodiment of a method for manufacturing a MEMS acoustic sensor provided according to the present disclosure.

Referring to FIG. 12 to FIG. 13, in operation S3, the shape of the arch portion 51a matches the shape of the structural gap 4a. The structural gap 4a only needs to cover the arch portion 51a, and the polymer layer 5 of the MEMS acoustic sensor 100 in the first embodiment of the present disclosure does not need to fully cover the piezoelectric material layer 3. The separate coverage of the structural gap 4a forms the MEMS acoustic sensor 100a in the second embodiment of the present disclosure. This structure uses fewer materials and reduces weight, which is conducive to the miniaturization of MEMS acoustic sensor 100a.

The second embodiment of the present disclosure provides a method for manufacturing a MEMS acoustic sensor, which can achieve various implementation methods and corresponding beneficial effects in the first embodiment of the present disclosure, which will not be repeated here to avoid repetition.

Third Embodiment

A method for manufacturing a MEMS acoustic sensor according to the third embodiment of the present disclosure is used to manufacture a MEMS acoustic sensor 100b.

The MEMS acoustic sensor 100b of the third embodiment of the present disclosure is basically the same as the MEMS acoustic sensor 100 of the first embodiment of the present disclosure. The difference between the MEMS acoustic sensor 100b of the third embodiment of the present disclosure and the MEMS acoustic sensor 100 is as follows.

Referring to FIG. 12 to FIG. 13, there multiple first grooves 31 and multiple second grooves 21, and the multiple first grooves are in one-to-one correspondence with the multiple second grooves. In operation S2, multiple cantilever beams formed by the piezoelectric material layer 3b are spaced apart from each other, and a first structural gap 41 is formed between adjacent two cantilever beams. The multiple cantilever beams are located at one end of the outer part of the piezoelectric material layer 3b that is adjacent to each other and are spaced apart to form a second structural gap 42. The first structural gap 41 is in communication with the second structural gap 42 and together form the structural gap 4b. The second structural gap 42 is located in the central area of the cavity 10b, and the structural gap 4b is in communication with the cavity 10b.

The arch portion 51b includes a first arch portion 511 and a second arch portion 512 in a circular shape. The shape of the first arch portion 511 matches the shape of the first structural gap 41, and the second arch portion 512 is arranged opposite to the second structural gap 42.

This structure eliminates the need for the arch portion 51b to be strictly arranged according to the shape of the structural gap 4b, where the surface of the piezoelectric material layer 3b close to the second structural gap 42 is narrow, and the arch portion 51b will not be adhered to during the forming process, thereby forming a 3D shape of the second arch portion 512. The structure of the second arch portion 512 can facilitate the piezoelectric material layer 3b to play a functional role in the vibration structure of the cantilever beam. In addition, whether to prepare arched 3D structure on the structural gap 4b is optional. If preparation is not required, no arched shape will be made at the corresponding part of the jig used for forming, so that specific 3D morphology can be achieved.

The third embodiment of the present disclosure provides a method for manufacturing a MEMS acoustic sensor, which can achieve various implementation methods and corresponding beneficial effects in the first embodiment of the present disclosure, which will not be repeated here to avoid repetition.

The embodiments mentioned in the present disclosure are for ease of expression. The above disclosure is only preferred embodiments of the present disclosure, and of course, the embodiments are not intended to limit the scope of the present disclosure. Therefore, the equivalent changes made according to the claims of the present disclosure still fall within the scope of the present disclosure.

Compared with the conventional art, in the method for manufacturing a MEMS acoustic sensor provided according to the present disclosure, a substrate is provided, and a structural layer and a piezoelectric material layer are stacked sequentially on a side of the substrate. Photolithography modeling is sequentially performed on the piezoelectric material layer and the structural layer to generate a first groove penetrating through the piezoelectric material layer and a second groove penetrating through the structural layer, respectively. The first groove is arranged directly opposite to and in communication with the second groove to form a structural gap together. A polymer layer is stacked on a side of the piezoelectric material layer away from the substrate, and the polymer layer completely covers the first groove. The substrate is etched in a direction from a side of the substrate away from the piezoelectric material layer towards the piezoelectric material layer, so that the substrate forms a cavity penetrating through the substrate, where the structural layer is covered on the side of the substrate close to the piezoelectric material layer to enable the second groove to be in communication with the cavity. A first part of a prefabricated jig is stacked on a side of the polymer layer away from the substrate, where an arch groove is defined on the first part to enable the arch groove to be arranged directly opposite to the structural gap. The jig, the substrate, the piezoelectric material layer, and the polymer layer are heated together to a first temperature to enable the polymer layer to be in a rubbery state, where a first ventilation hole penetrating through the first part is further defined on the first part, the first ventilation hole is in communication with the arch groove and outside, and the first temperature is a glassy transition temperature of the polymer layer. Air at a predetermined pressure is introduced into the cavity and a pressure inside the cavity is controlled to reach a predetermined value, to enable a part of the polymer layer opposite to the arch groove to deform and adhere to an inner wall of the arch groove to form an arch portion. An atmospheric pressure load of the air is maintained and the air is cooled to below the first temperature, to enable the polymer layer to be in a glassy state. The pressure inside the cavity is stopped to be controlled and the pressure inside the cavity is reduced, the jig is disassembled, and a wafer is cut according to a preset shape to obtain the MEMS acoustic sensor. In the above operations, the significant changes in the mechanical properties of the polymer layer at the first temperature and the load control of temperature and air pressure to achieve the preparation of 3D morphology. Due to the absence of traditional assembly processes during the implementation process, the alignment accuracy is high, yield is high, repeatability is desirable, and the cost is low, and the process is simple. Thus, the method for manufacturing a MEMS acoustic sensor provided according to the present disclosure can effectively improve the accuracy and reliability in processing.

The above is only preferred embodiments of the present disclosure and do not limit the scope of the present disclosure. Any equivalent structure or equivalent process transformation made using the description and accompanying drawings of the present disclosure, or directly or indirectly applied in other related technical fields, are equally included in the scope of protection of the present disclosure.

The invention claimed is:

1. A method for manufacturing a MEMS acoustic sensor, comprising:
   providing a substrate, and sequentially stacking a structural layer and a piezoelectric material layer on a side of the substrate;
   performing photolithography modeling on the piezoelectric material layer and the structural layer sequentially to generate a first groove penetrating through the piezoelectric material layer and a second groove penetrating through the structural layer, respectively; wherein the first groove is arranged directly opposite to and in communication with the second groove to form a structural gap together;
   stacking a polymer layer on a side of the piezoelectric material layer away from the substrate, and completely covering the first groove with the polymer layer;
   etching the substrate in a direction from a side of the substrate away from the piezoelectric material layer towards the piezoelectric material layer, so that the substrate forms a cavity penetrating through the substrate, wherein the structural layer is covered on the side of the substrate close to the piezoelectric material layer to enable the second groove to be in communication with the cavity;
   stacking a first part of a prefabricated jig on a side of the polymer layer away from the substrate, wherein an arch groove is defined on the first part to enable the arch groove to be arranged directly opposite to the structural gap; heating the jig, the substrate, the piezoelectric material layer, and the polymer layer together to a first temperature to enable the polymer layer to be in a rubbery state, wherein a first ventilation hole penetrating through the first part is further defined on the first part, the first ventilation hole is in communication with the arch groove and outside, and the first temperature is a glassy transition temperature of the polymer layer;
   introducing air at a predetermined pressure into the cavity and controlling a pressure inside the cavity to reach a predetermined value, to enable a part of the polymer layer opposite to the arch groove to deform and adhere to an inner wall of the arch groove to form an arch portion;
   maintaining an atmospheric pressure load of the air and cooling the air to below the first temperature, to enable the polymer layer to be in a glassy state; and
   stop controlling the pressure inside the cavity and reducing the pressure inside the cavity, disassembling the jig, and cutting a wafer according to a preset shape to obtain the MEMS acoustic sensor.

2. The method for manufacturing a MEMS acoustic sensor according to claim 1, wherein the substrate is an SOI wafer or a silicon wafer, and the piezoelectric material layer comprises at least one layer of piezoelectric material and an upper electrode and a lower electrode attached to opposite sides of the piezoelectric material, respectively.

3. The method for manufacturing a MEMS acoustic sensor according to claim 1, wherein the piezoelectric material is any one of PZT, AlN, AlScN, and ZnO.

4. The method for manufacturing a MEMS acoustic sensor according to claim 1, wherein the polymer layer is any one of PEEK, PEI, PI, or PEN.

5. The method for manufacturing a MEMS acoustic sensor according to claim 1, wherein introducing the air at the predetermined pressure into the cavity comprises:

stacking a second part of the jig on the side of the substrate away from the piezoelectric material layer and completely covering the cavity, wherein a second ventilation hole penetrating through the second part is defined on the second part, to enable the cavity to be in communication with the second ventilation hole; and introducing the air at the predetermined pressure into the cavity through the second ventilation hole.

6. The method for manufacturing a MEMS acoustic sensor according to claim 1, wherein there are a plurality of first grooves and a plurality of second grooves, and the plurality of first grooves are in one-to-one correspondence with the plurality of second grooves.

7. The method for manufacturing a MEMS acoustic sensor according to claim 6, wherein the polymer layer is in a shape of block and completely covers the structural gap.

8. The method for manufacturing a MEMS acoustic sensor according to claim 6, wherein a groove width of the arch groove is greater than or equal to a width of the structural gap.

\* \* \* \* \*